United States Patent [19]
Clough

[11] Patent Number: 5,762,753
[45] Date of Patent: Jun. 9, 1998

[54] DELAMINATING METHOD AND APPARATUS

[76] Inventor: Arthur H. Clough, 169 Fiske Rd., Hardwick, Mass. 01082

[21] Appl. No.: 673,911

[22] Filed: Jul. 1, 1996

Related U.S. Application Data

[62] Division of Ser. No. 347,882, Dec. 1, 1994, Pat. No. 5,556,499.

[51] Int. Cl.$^6$ .................................................. B32B 35/00
[52] U.S. Cl. ........................ 156/584; 156/344; 384/192; 384/419
[58] Field of Search .................................. 156/344, 584; 271/280, 281, 285; 384/419, 192; 242/615.2

[56] References Cited

U.S. PATENT DOCUMENTS

| | | | |
|---|---|---|---|
| 905,355 | 12/1908 | Peckham | 384/191.2 |
| 1,291,021 | 1/1919 | Kiefer | 384/419 |
| 1,428,328 | 9/1922 | Hawks | 384/419 |
| 1,550,614 | 8/1925 | Hunt | 384/419 |
| 1,816,801 | 7/1931 | Vauclain . | |
| 2,053,848 | 9/1936 | Seyfried | 384/397 |
| 2,075,595 | 3/1937 | Whiting | 19/139 |
| 2,096,923 | 10/1937 | Schwehm | 19/139 |
| 2,162,890 | 6/1939 | Horne et al. | 106/7.6 |
| 2,585,017 | 2/1952 | Kostolnik | 308/79.1 |
| 2,804,656 | 9/1957 | Purdy | 19/139 |
| 2,833,600 | 5/1958 | Lyons | 308/53 |
| 2,906,567 | 9/1959 | Runton et al. | 308/53 |
| 2,964,806 | 12/1960 | Naegeli | 19/139 |
| 3,178,774 | 4/1965 | Pippin et al. | 19/245 |
| 3,711,171 | 1/1973 | Orkin et al. | 308/241 |
| 3,782,736 | 1/1974 | Valente | 277/24 |
| 3,842,769 | 10/1974 | Maynard | 114/312 |
| 3,918,808 | 11/1975 | Narita | 355/15 |
| 3,952,654 | 4/1976 | Evans | 101/425 |
| 3,957,509 | 5/1976 | McMullen et al. | 96/1 R |
| 4,072,371 | 2/1978 | Hill et al. | 308/56 |
| 4,205,911 | 6/1980 | Dole | 355/15 |
| 4,211,484 | 7/1980 | Iwai et al. | 355/15 |
| 4,264,191 | 4/1981 | Gerbasi et al. | 355/15 |
| 4,267,241 | 5/1981 | Mahrus et al. | 428/645 |
| 4,297,021 | 10/1981 | Tani et al. | 355/3 R |
| 4,349,934 | 9/1982 | Margittai | 15/256.51 |
| 4,400,082 | 8/1983 | Kiba | 355/15 |
| 4,407,219 | 10/1983 | Dellevoet | 118/60 |
| 4,427,289 | 1/1984 | Oda | 355/15 |
| 4,475,807 | 10/1984 | Toyoda et al. | 355/15 |
| 4,489,823 | 12/1984 | Gordon | 198/499 |
| 4,501,620 | 2/1985 | Oda | 134/6 |
| 4,577,363 | 3/1986 | Wyse | 15/256.5 |
| 4,621,386 | 11/1986 | Hill | 15/104.01 R |
| 4,792,244 | 12/1988 | Yamashita et al. | 384/492 |
| 4,870,466 | 9/1989 | Iida | 355/297 |
| 4,876,875 | 10/1989 | Bruggeman et al. | 72/199 |
| 4,878,093 | 10/1989 | Edmunds | 355/296 |
| 4,896,975 | 1/1990 | Bescoby et al. | 384/114 |
| 4,983,468 | 1/1991 | Oda | 428/621 |
| 5,054,940 | 10/1991 | Momose et al. | 384/193 |
| 5,083,873 | 1/1992 | Momose et al. | 384/280 |
| 5,094,550 | 3/1992 | Momose et al. | 384/420 |
| 5,111,251 | 5/1992 | Uno et al. | 355/297 |
| 5,127,745 | 7/1992 | Momose et al. | 384/276 |
| 5,130,755 | 7/1992 | Ikegawa et al. | 355/296 |
| 5,135,314 | 8/1992 | Momose et al. | 384/275 |
| 5,146,675 | 9/1992 | Ford et al. | 29/123 |
| 5,174,660 | 12/1992 | Seibig | 384/420 |

(List continued on next page.)

*Primary Examiner*—Mark A. Osele
*Attorney, Agent, or Firm*—Leslie Payne

[57] ABSTRACT

Method and apparatus for peeling a layer from a laminate utilizing a peel rod about which the layer is guided during peeling. The peel rod is continuously supported along its length by a bearing sleeve having a longitudinal passage receiving the rod and in turn supported in a holder. The bearing sleeve has a longitudinal opening in its wall communicating with its longitudinal passage, and the edge of the opening forms a continuous scraping edge for scraping debris from the rod. A cleaning pad of SCOTCH BRITE material extends radially through the bearing to engage the rod. The peeling rod and bearing are made of low friction material such as a ceramic, and the rod is preferably driven by a motor.

5 Claims, 4 Drawing Sheets

U.S. PATENT DOCUMENTS

| | | | |
|---|---|---|---|
| 5,175,591 | 12/1992 | Dunn et al. | 355/297 |
| 5,191,381 | 3/1993 | Yuan | 355/285 |
| 5,191,672 | 3/1993 | Boston et al. | 15/256.5 |
| 5,220,391 | 6/1993 | Tange | 355/297 |
| 5,258,816 | 11/1993 | Haneda et al. | 355/296 |
| 5,265,537 | 11/1993 | Gasparrini et al. | 101/425 |
| 5,283,621 | 2/1994 | Hashizume | 399/331 |
| 5,284,394 | 2/1994 | Lemelston | 384/463 |
| 5,303,010 | 4/1994 | Takano et al. | 399/284 X |
| 5,307,861 | 5/1994 | Townsend | 164/428 |
| 5,317,966 | 6/1994 | Hackelborger | 101/147 |
| 5,321,482 | 6/1994 | Yano et al. | 355/299 |
| 5,322,735 | 6/1994 | Fridez et al. | 428/357 |
| 5,329,664 | 7/1994 | Boston et al. | 15/256.5 |
| 5,457,520 | 10/1995 | Schell et al. | 384/419 X |

DELAMINATING METHOD AND APPARATUS

This is a divisional of application Ser. No. 08/347,882, filed 1 Dec. 1994 now U.S. Pat. No. 5,556,499.

BACKGROUND OF THE PRESENT INVENTION

The present invention generally relates to methods and apparatus for peeling or delaminating a composite sheet structure such as, for example, a laminate containing image media. The laminate may be used to provide a "master" image. Prior to peeling, the image is typically produced in the laminate by thermal imaging enabling a high resolution image to be achieved. For a more detailed description of the laminate composition to which the present invention may be applied, reference may be had to commonly assigned International Patent Application No. PCT/US 87/03249 published Jun. 16, 1988 under International Publication Number WO 88/04237; and U.S. Pat. No. 5,200,297. After this laminate has been imaged, it is delaminated by peeling one layer therefrom and having the remaining imaged media relaminated with a protective coating. For a more detailed description of the imaging technique and associated peeling process, reference is made to commonly assigned U.S. Pat. Nos.: 5,141,584 to Schuh et al. and 5,159,352 to Ferla et al. The present invention may also be applied to other laminates, for example those used to make printed circuit boards.

In the peeling process, a take-away layer is peeled from an image-forming layer adhered to a substrate of the laminate by passing the laminate through the nip of peel rolls while the take-away layer is peeled and moved about the upper peel roll. However it is now known in the art that the step of dry peeling can produce defects in the image. This is due in part to the alternating high and low density areas in the image forming layer produced by thermal imaging.

Imaging defects can also be produced by debris or extraneous particles from various sources accumulating on the laminate during travel from the point of manufacture to the peeling station, whereby such debris tends to accumulate on the rotating peel rod and causes formation of image artifacts in the image-forming layer. It has therefore been found to be very important to eliminate debris from the peel roll or rod in order to prevent the formation of the noted artifacts.

OBJECTS OF THE PRESENT INVENTION

An object of the present invention is to provide novel and improved methods and apparatus for delaminating a composite sheet structure or laminate. Included in the aforementioned object is the provision of such methods and apparatus which will serve to reduce defects in image media laminates due to delamination so as to improve the quality of the image that may be produced through use of the laminate.

A further object is to provide novel and improved methods and apparatus for peeling a laminate containing image media and which are suitable for commercial production and use in conjunction with laser print engines.

A further object of the present invention is to provide novel methods and apparatus for removing debris from, and cleaning, a peel rod used in a delamination process.

Another object of the present invention is to provide novel and improved methods and apparatus for effectively supporting a peel rod used in a delamination process. Included herein is a novel bearing assembly for rotatably supporting the peel rod while also having provision for cleaning the peel rod during use in a delaminating process.

A still further object of the invention is a dry, non-woven, abrasive pad material which extends along the operative length of the peel rod for removing debris.

A still further object of the present invention is to provide a novel bearing for a peel rod that will provide continuous support along the longitudinal dimension of the peel rod and at the same time a scraping edge for cleaning debris from the peel rod during a delamination process.

SUMMARY OF PREFERRED FORMS OF THE INVENTION

In one preferred form of the invention, a peeling rod of a peeler-delaminator is supported along its longitudinal dimension by a longitudinally continuous sleeve-like bearing which has a segmented wall formed by a longitudinal opening in the wall communicating with the longitudinal passage of the sleeve that receives the peeling rod. The wall of the bearing which defines one side of the opening, forms a scraping edge for removing debris from the rod. An abrasive means such as an open and non-woven scrubbing pad is also preferably held in the bearing wall opposite the opening for engaging the peeling rod to remove debris from the rod. The bearing is supported in a holder which in turn is secured to the frame of the peeling machine.

In use, the peel rod is loaded against the bearing by the laminate and opposing peel roll which engages and moves about the peeling rod. As the radius of curvature of the internal bearing surface is greater than that of the exterior surface of the peeling rod, the rod becomes eccentrically positioned in the bearing and makes contact with the bearing surface along a line of contact. In another preferred form of the invention, the peel rod makes contact along two lines of contact for better stability and a greater torque assistance operating window. The contact surfaces of the bearing and the peeling rod are made from low friction material.

DRAWINGS

Other objects and advantages of the present invention will become apparent from the following more detailed description taken in conjunction with the attached drawings in which.

DETAILED DESCRIPTION OF PREFERRED EMBODIMENT

Figure 1:
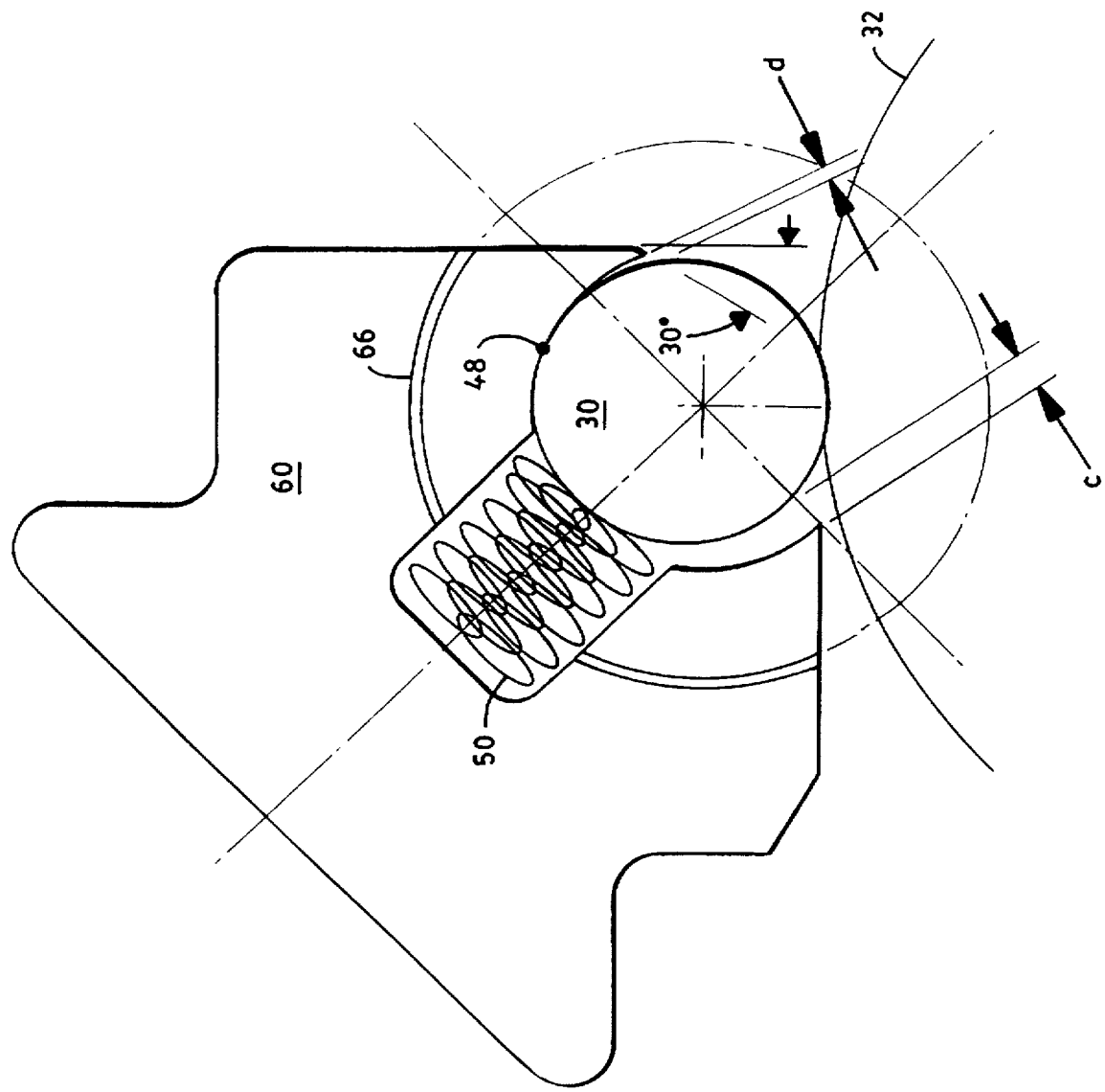
FIG. 1 is a transverse cross-sectional view of a delaminating apparatus incorporating a prepared embodiment of the present invention.
Figure 1A:
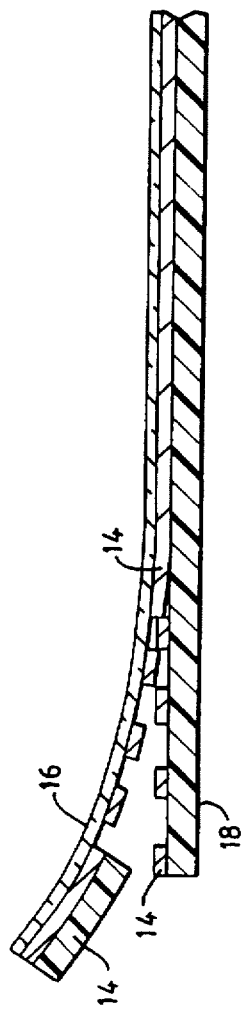
FIG. 1a is a cross-sectional view of one type of lamination to which the present invention may be applied.
Figure 6:
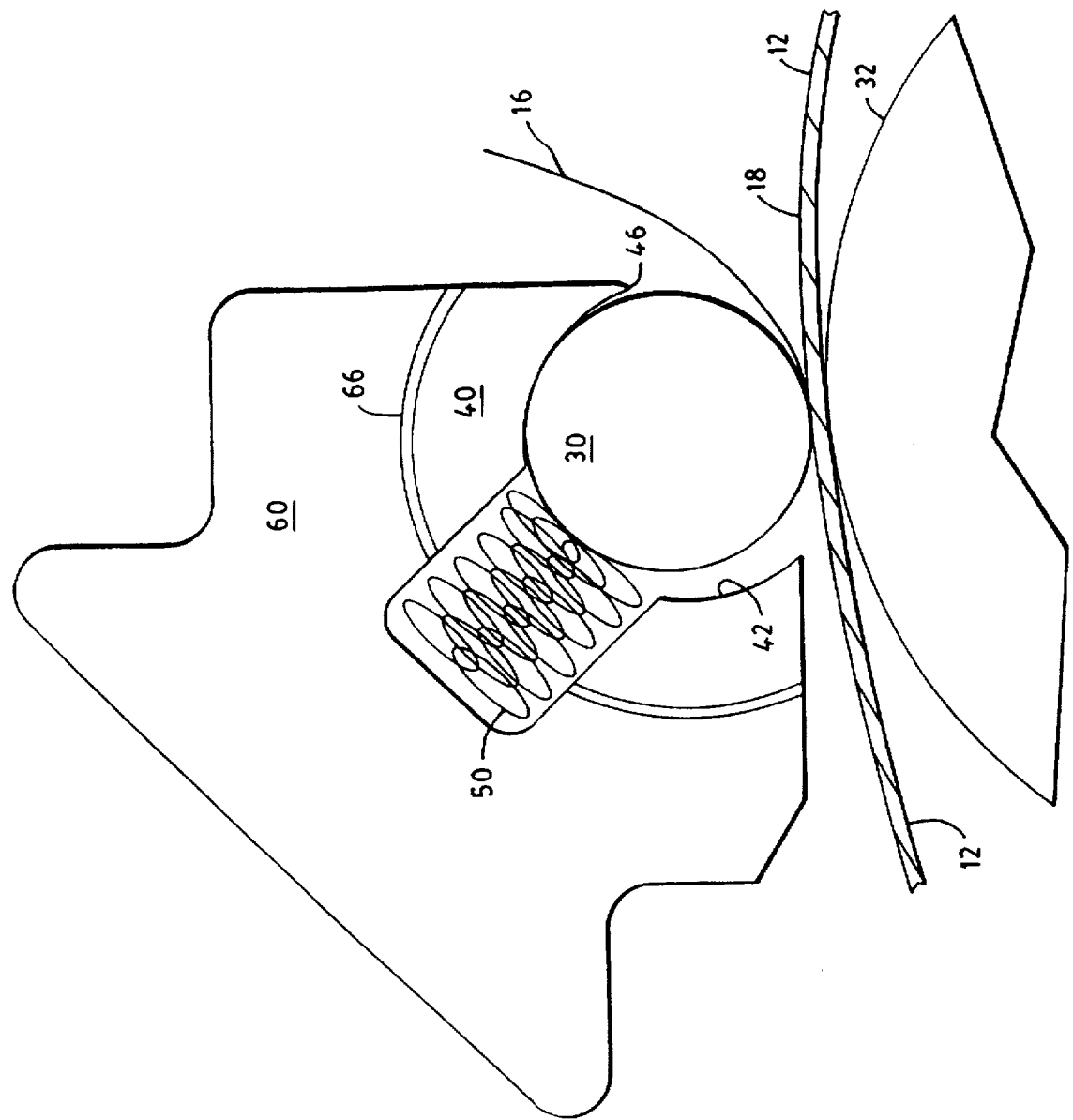
FIG. 6 is a view generally similar to FIG. 1 but also showing a laminate as it is peeled by the apparatus.

Referring now to the drawings in detail, there is shown in FIGS. 1 and 6, apparatus constituting a preferred form of the invention for peeling a layer from a laminate 12 shown in FIG. 1a and which by way of example, may include an internal image-forming layer 14 including an image-forming material such as carbon, and opposite image-bearing layers 16 and 18 on opposite sides of the image forming layer 14, and adhesive layers; respectively, bonding the image-bearing layers to the image-forming layer 14. A further description of such laminates to which the present inventions may be applied are disclosed in the commonly assigned International Patent Application PCT/US 87/03249 published Jun. 16, 1988; it being understood that the laminate itself forms no part of the present invention. The disclosures of the aforementioned patent application and commonly owned U.S. Pat. Nos. 5,159,352 and 5,141,584 are hereby incorporated herein by reference as part hereof. It will be understood that the present invention may be applied to equal advantage to other laminates and therefore need not be limited to the specific laminate described.

Referring to FIG. 6, the laminate 12 is conveyed into the nip formed by a peel rod 30 and an underlying peel roll 32 which also serves to drive the laminate 12 between the nip. As the laminate emerges from the nip a take-away layer 16 is peeled upwardly about the peel rod 30 while the remainder 18 of the laminate 12 continues generally along the path of conveyance.

Figure 2:
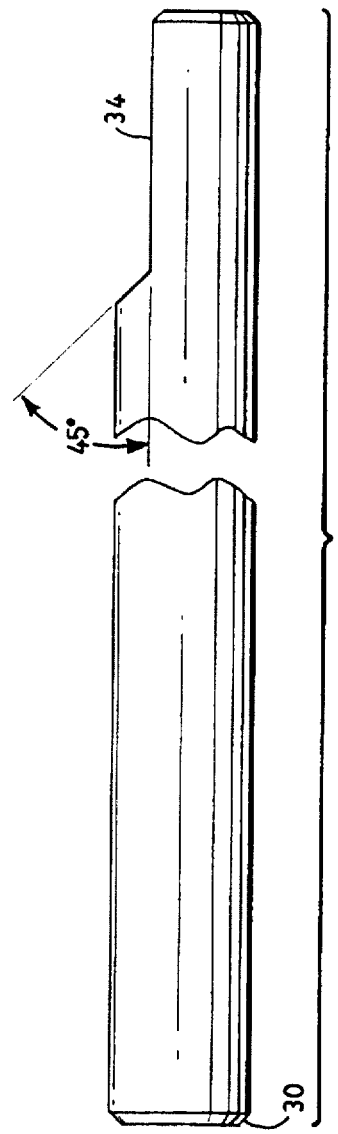
FIG. 2 is a side elevational view to a reduced scale of a peel rod incorporated in the apparatus of FIG. 1.
Figure 4:
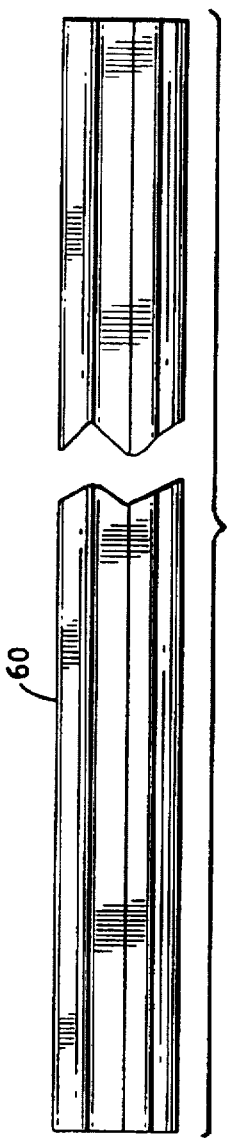
FIG. 4 is a side front elevational view of a bearing and holder assembly incorporated in the apparatus of FIG. 1.
Figure 3:
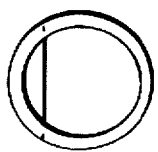
FIG. 3 is an end view of the rod of FIG. 2.
Figure 5:
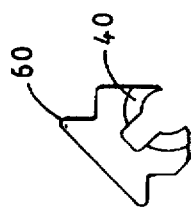
FIG. 5 is an end view of the assembly of FIG. 4.

Peel rod 30 in the shown embodiment is solid, generally cylindrical and made from a material having a low coefficient of friction. In one preferred form, the material may be a ceramic such as, for example, stabilized zirconia. As shown in FIG. 2, one end of the rod, in the preferred embodiment, is formed with a flat surface for receipt in a coupling which is torsionally stiff yet laterally and angularly flexible and which connects the rod 30 to a motor (not shown) to drive the rod in rotation during use as will be described below. In one embodiment, the peel rod 30 may have an overall length of about 910 mm. and a diameter of about 6.0 mm.

In accordance with one of the features of the present invention, peeling rod 30 is supported substantially continuously along its length by a bearing generally designated 40 having a sleeve-like body with an internal axially or longitudinally-extending passage receiving peel rod 30. An internal surface 42 of the bearing 40 which defines the passage is also shown as a cylindrical surface but with a radius of curvature greater than that of rod 30 so as to provide a clearance "c" (FIG. 1) which in the particular embodiment shown is about 0.02 mm. The length of the bearing is generally coextensive with peel rod 30 so as to provide continuous support for the latter.

Extending longitudinally in the wall throughout its length and radially into communication with the bearing passage 44 is an opening exposing peel rod 30 for engagement with the laminate 12 as shown in FIG. 6. One side of the bearing 40 along one edge of the opening 42 defines a scraper edge 46 which acts like a doctor blade to scrape or remove debris from the surface of the peel rod during use. It is preferred that the wall of the bearing be bevelled at a 30° angle as best shown in FIG. 1 to provide scraper 46 with a knife edge. However, other angles can be selected so long as they provide the degree of scraping which is desired. It will be noted that this preferred angle can vary to provide the degree of scraping which is desired. It will be noted that the angle can vary to provide a compromise between sharpness and durability. During use the combined forces of the nip roll 32 and laminate 12 on the peel roll together with the reaction forces of the bearing, will serve to urge or bias the peel rod 30 into intimate contact against the bearing surface 42 to contact it along a line of contact at a point 48 (FIG. 1) in the first quadrant of the bearing with the diametrically opposite surface of the peel rod 30 being spaced from the bearing surface 42 as described above. This positioning of the peel rod 30 is such as to bring it very close such as near intimate contact, with almost no clearance, to the scraper edge 46 to insure effective removal of all debris. The tip of the scraper edge can have a clearance "b" in the order of about 0.005 mm to 0.010 mm It will be appreciated that such clearance dimensions are illustrative.

Although it is preferred that the bearing surface 42 be circular, in other embodiments it may be non-circular such that the peeling rod will contact it in at least two lines of contact as the peeling rod rotates. In the preferred embodiment the bearing 40 is also made from a suitable ceramic such as stabilized zirconia like the rod 30. However, in other forms of the invention both the bearing 40 and peel rod 30 may be made from a high polished steel with contact surfaces treated and coated with a material of low coefficient of friction, such as Poly-Ond which is an electroless-nickel and Teflon plating material. This material is commercially available from Poly-Plating Inc., Chicopee, Mass. USA.

In accordance with another feature of the present invention, a cleaning means, such as a non-woven pad generally designated 50 is provided to remove debris and other particles from the surface of the peel rod 30. Pad 50 is made of an open and non-woven web material, wherein each fiber is covered with an abrasive material, such as aluminum oxide. An example of such a pad is commercially available from 3M under the trademark SCOTCH-BRITE. The aluminum oxide is selected because it is softer than ceramic peel rod 30. Such material will provide the desired abrasive action while at the same time its porous nature assists in real time accumulation of the removed debris particles from the surface of the peel rod. While this embodiment has shown the pad comprising abrasive particles, it will be understood that the pad need not have such abrasive characteristics. In addition, the resiliency of pad 50 provides a certain inherent biasing force on the peel rod 30 so as to even further insure that it intimately engages and grinds the particles from the rod. It also helps provide the desired position of the peel rod 30 in the bearing 40 to contact the bearing at point 48 and with the surface of the rod 30 against the scraper edge 46 with near intimate contact or virtually no clearance. Because the fibers are coated with the abrasive, there is less disintegration of the pad during use. Although the cleaning means of the invention is depicted as a pad, it will be appreciated that the pad can be biased by a spring (not shown). In addition the cleaning pad 50 could be mounted on a roll so that spent portions could be easily replaced with a fresh segment of cleaning material.

In the preferred embodiment shown, the bearing 40 is provided with a radial slot for receiving the cleaning pad 50. Further in the preferred embodiment, the bearing is in turn supported by a holder generally designated 60 which is generally coextensive in length with the bearing. Holder 60 has an arcuate receptacle 62 for receiving the bearing 40 as best shown in FIG. 6. Preferably holder 60 is an aluminum extrusion with a generally dove-tail shape to which the peel rod 30 is bonded at 66 by a suitable material such as an epoxy resin. In order to accommodate the cleaning pad 50 the holder is also provided with a channel-like opening for receiving the pad 50. The holder 60 with the bearing assembly is mounted in opposite frame portions (not shown) of a peeler-laminator machine. A wavy leaf spring (not shown) may also be used to bias the holder 60 in proper position in the frame so as to properly position the apparatus.

In use during peeling, the peel rod 30 will be rotated by an associated motor to maintain smooth rotation of the rod 30 despite retarding forces produced by the scraping at edge 46 and scrubbing at pad 50. Moreover the peel rod 30 will be biased into its eccentric position in the bearing where it makes point contact along a longitudinal line and with virtually no clearance between the scraping edge 46 and the rod 30 to insure effective removal of all debris from the surface of the rod. The bearing will not only provide effective support along the entire longitudinal dimension of the peel rod, it will also provide a very smooth contact surface on the order of a 1 to 12 microinch finish. Furthermore the bearing will be extremely durable and easily replaceable and/or maintained and without the need of adjustment screws and the like to hold the peel rod in proper position.

Figure 7A:
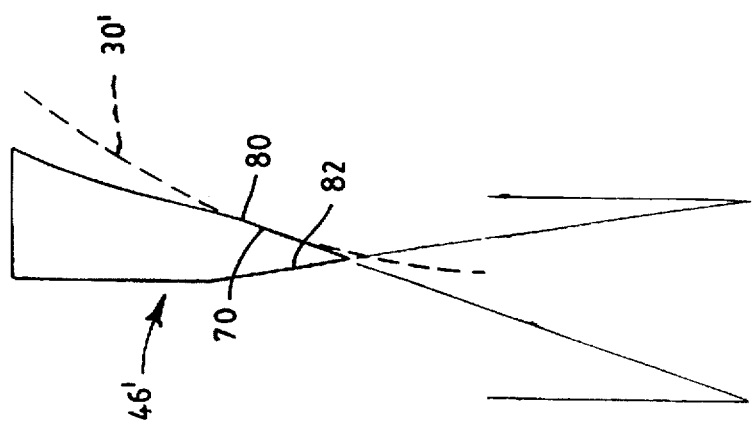
FIG. 7 is a view of another embodiment showing two lines of contact between the bearing and the rod; and, FIG. 7A is an enlarged view of a doctor blade configuration for use in the embodiment illustrated in FIG. 7.
Figure 7:
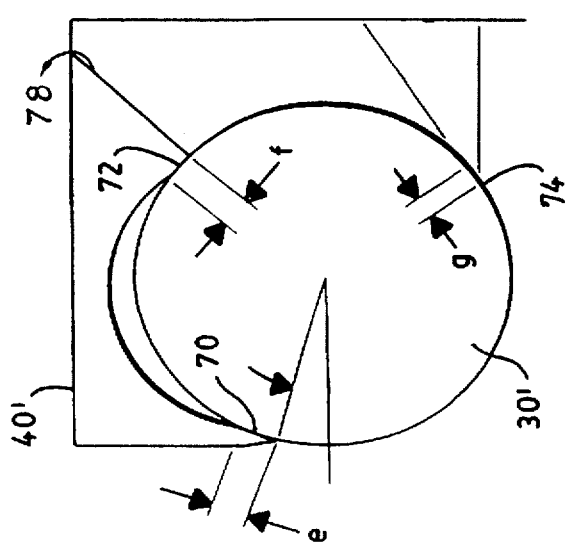

FIGS. 7 and 7A illustrate another preferred embodiment of the present invention, wherein there is provided another peel rod 30' and a bearing 40' which are similar to those described above. In this embodiment, however, there is provided three areas of contact therebetween as indicated at areas 70, 72, and 74; respectively. The areas are generally flat portions of the bearing in which the peel rod 30' will contact along lines on contact. It will be noted that the peel rod 30' makes lines of contact at the individual contact areas 70 and 72 during its rotation in use, while it makes lines of contact at the areas 70 and 74 when the peel rod 30' is not under load. The bearing 40' has a non-circular portion 76 formed between the contact points 70 and 72. An opening or channel 78 is formed along the length of the bearing 40' between the contact areas 72 and 74. As in the other embodiment, the bearing can be made of a ceramic material or for that matter a plastic material. The contact channel 78 is sized so as to accommodate a cleaning pad (not shown) of the type previously noted. The contact area 70 can have a dimension "e" of about 0.6 mm as illustrated; the contact area 72 can have a dimension "f" of about 0.5 mm as illustrated; the contact area 74 can have a dimension "g" as illustrated. In use, the peel rod 30' has two lines of contact with the contact areas 70 and 72 while the peel rod is rotated and under the tension of the layer being peeled. The first line of contact is located away from the scraper blade edge 46' which is formed by lapped surfaces 80 and 82 as shown more clearly in FIG. 7A. As noted earlier, by having two lines of contact between the peel rod and the bearing, there is better rod stability and a greater torque assist operating window.

Although several specific and preferred methods and apparatus of the present invention have been shown and described above, other variations of the present invention will become apparent to those skilled in the art. The scope of the invention is therefore not limited to the specific forms shown and described but rather is indicated by the claims below.

What is claimed is:

1. A bearing and peel rod combination used in a delaminating apparatus wherein a laminate is moved about the peel rod, the bearing comprising a generally sleeve bearing having a longitudinal through passage for receiving a peel rod, said bearing having a surface defining said passage formed of low friction material; said bearing having a longitudinally extending opening in a wall thereof communicating with said passage and a longitudinal edge on one side of said opening for scraping debris from the peel rod located in said passage during use; said bearing including at least three longitudinal areas, each defining a line of contact, the peel rod contacting only a pair of said three contact areas during rotation thereof, and contacting only the third contact area and one of the pair of contact areas during non-rotation of the peel rod.

2. The bearing defined in claim 1 including an elongated holder having a receptacle receiving the bearing, and means fixing the bearing to said holder.

3. The bearing defined in claim 1 further including a pad received in the bearing and the holder and extending into said passage for engaging and cleaning a peel rod in the passage during use.

4. The bearing defined in claim 1 wherein said material of said bearing surface is ceramic.

5. The bearing defined in claim 1 wherein said material of said bearing surface is coated with a substance having a low coefficient of friction.

* * * * *